(12) United States Patent
Funada et al.

(10) Patent No.: US 6,417,731 B1
(45) Date of Patent: Jul. 9, 2002

(54) DISTORTION-COMPENSATED AMPLIFIER DEVICE

(75) Inventors: Kiyoshi Funada; Junichiro Yamakawa; Junya Dosaka; Yasuo Sera, all of Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 09/820,293

(22) Filed: Mar. 29, 2001

(30) Foreign Application Priority Data

Sep. 22, 2000 (JP) ........................................ 2000-288604

(51) Int. Cl.$^7$ .............................................. H03F 1/26
(52) U.S. Cl. ........................................ 330/149; 330/151
(58) Field of Search .................................. 330/149, 151

(56) References Cited

U.S. PATENT DOCUMENTS

| | | | |
|---|---|---|---|
| 5,155,448 A | * 10/1992 | Powell | 330/149 |
| 5,877,653 A | 3/1999 | Kim et al. | 330/149 |
| 5,892,397 A | * 4/1999 | Belcher et al. | 330/149 |
| 5,977,825 A | * 11/1999 | Mueck | 330/151 |
| 6,011,434 A | 1/2000 | Sakai | 330/151 |

FOREIGN PATENT DOCUMENTS

| | | |
|---|---|---|
| JP | 10-190361 | 7/1998 |
| JP | 10-284951 | 10/1998 |

* cited by examiner

Primary Examiner—Michael B Shingleton
(74) Attorney, Agent, or Firm—Wenderoth, Lind & Ponack, L.L.P.

(57) ABSTRACT

Excellent compensation of the distortion is realized with a distortion-compensated amplifier device that compensates a distortion that is generated in a main amplifier, through the respective operations of a circuit comprised of a distortion-detecting loop and a distortion-compensating loop and a pre-distortor. In a distortion-detecting loop, the signal is distributed. With respect to one distribution signal, a vector adjuster (2) performs vector adjustment of it and the pre-distortor (3) generates a distortion. A main amplifier (4) amplifies this signal. The resulting amplification signal and the other distribution are composed, whereby a distortion component is detected. In a distortion-compensating loop, that amplification signal and this distortion component are composed to thereby eliminate the distortion component from the amplification signal. In a control part, a distortion component level detecting means (12) detects the levels of the distortion component that is detected. Vector adjusting/controlling means (14) and (15) controls the vector adjusting means (2) to thereby make the average value of those levels small. On the other hand, pre-distortor controlling means (16) and (17) controls the pre-distortor (3) to thereby make the peak values of those levels.

17 Claims, 10 Drawing Sheets

(a)

(b)

(c)

DISTORTION-COMPENSATED AMPLIFIER DEVICE

BACKGROUND OF THE INVENTION

1. Field of the Invention

The present invention relates to a distortion-compensated amplifier device that, when amplifying the signal by a main amplifier, compensates a distortion that is generated in the main amplifier with use of a circuit comprised of a distortion-detecting loop and a distortion-compensating loop and a pre-distortor, or a method of performing such distortion-compensated amplification. More particularly, the invention concerns a technique for realizing excellent compensation of the distortion.

2. Description of the Related Art

In a mobile wireless communication system such as, for example, a portable telephone system, a base station apparatus and a mobile station apparatus have been performing wireless communication of a signal. Also, there is a case where between the base station apparatus and the mobile station apparatus there is provided a relay station apparatus for relaying wireless communication. In this case, the relay station apparatus receives and amplifies the signal that is wireless-transmitted from the base station apparatus, and wirelessly transmits this amplification signal to the mobile station apparatus.

In the above-described base station apparatus or the relay station apparatus, it has been performed to amplify, for example, a signal becoming an object to be transmitted with use of an amplifier (a main amplifier). However, in such a main amplifier, due to its non-linearity characteristic, in case the level of the input signal is high, it inconveniently happens that a distortion occurs. Accordingly, it becomes necessary to eliminate the distortion (i.e. compensate the distortion) from the amplification signal.

As an amplifier device having a circuit for eliminating the above-described distortion from the amplification signal there is known, for example, a feed forward type distortion-compensated amplifier device. This distortion-compensated amplifier device has a distortion-detecting loop and a distortion-compensating loop. The distortion-detecting loop amplifies the signal by the main amplifier and simultaneously detects a distorted component from this amplification signal. The distortion-compensating loop eliminates the distortion component that has been detected from the amplification signal that is output from the main amplifier. It is to be noted that, as one example, such a distortion-compensated amplifier device has a construction wherein a circuit construction portion regarding a pre-distortor 63 has been omitted from the circuit construction illustrated in FIG. 9, as later described.

However, even in case compensating the distortion by the above-described distortion-compensated amplifier device, when inconveniently the following signal is input to the distortion-compensated amplifier device, at the following time the following inconvenience occurs. The signal is the one that inconveniently contains peak powers that instantaneously occur as in the case of, for example, a multi-carrier signal or a CDMA (Code Division Multiple Access) signal. Said time is when such peak powers inconveniently reach the non-linearity region of the main amplifier. Said inconvenience is that, in the instant of such reach, the amount of signal canceled (the amount of cancel of the input signal other than the distortion component) at the distortion-detecting loop placed under the control of feed forward control gets degraded. For this reason, the level of the signal (originally, the signal corresponding to the distortion component) that is output from the distortion-detecting loop inconveniently increases.

Here, in FIG. 8 there is illustrated an example of the model that has been prepared by simplifying the distortion-detecting loop. In this model, a signal that is input is distributed by a distributor K1. With respect to one distribution signal, vector adjustment (the adjustment of the amplitude and phase) is performed using a vector adjuster K2. Also, the (one) distribution signal after the adjustment of the vector and the other distribution signal are composed by a composer K3, whereby a composite signal is output. In this case, in the vector adjuster K2, vector adjustment is performed so that the two signals, which are to be composed by the composer K3, may have the same amplitude (a state where the amplitudes are the same) and opposite phases (a state where the phases are displaced 180° from each other). As a result of this, in the composer K3, the two signals that are to be composed together cancel each other by this composing.

In this model, it is known that the amount of signals canceled in the distortion-detecting loop, W, is expressed in the form of the following equation. It is to be noted that the d in the equation represents the amplitude deviation (dB) and the p represents the phase deviation (deg).

(First Equation)

$$W = 10\ \log(1 + 10^{d/10} - 2 \times 10^{d/20} \times \cos p) \quad (1)$$

Specifically, in the distortion-detecting loop, the vector adjuster K2 (e.g. a vector adjuster 62 in FIG. 9 as later described) equipped in this loop is controlled so that the level of the signal (e.g. the level of the distorted component detected by a level detector 72 in FIG. 9 as later described) may become minimum (i.e. so that the amount of cancel of the input signal in the loop may become maximum).

However, assume that, for example, in case the instantaneous peak powers such as those described above are inconveniently input, for some reason or other, the operational balance of the distortion-detecting loop has collapsed 1 dB. Then, the amount of signal canceled in the loop degrades to approximately 18 dB. In this case, assume that the loop was so far at all times operating with an amount of signal cancel of, for example, 30 dB or more. Then, a signal (distorted component) the level of that is even approximately 12 dB higher than in an ordinary case is inconveniently input to an error amplifier equipped to the loop. (The amplifier is the one for amplifying the distortion component detected by the distortion-detecting loop, and is e.g. an error amplifier 70 in FIG. 9 as later described.)

And, once an excessively high level of signal has been input to the error amplifier, the amount of distortion that occurs in this error amplifier increases. Thereby, the amount of distortion occurring from the distortion-compensated amplifier device as a whole (the amount of the distortion remaining, and contained, in the amplification signal that is output from the distortion-compensated amplifier device) also increases. Assume that, further, the excessively high level of input signal to the error signal has reached a gain-saturation region (the region where the gain is saturated) or a phase non-linearity region (the region where the phase of the output signal is deviated from a flat straight line). Then, the operational balance of the distortion-compensating loop collapses with the result that the amount of signal canceled in the loop (the amount of distortion-compensated) is degraded. Therefore, the signal is inconveniently output from the distortion-compensated amplifier device without having sufficiently suppressed its distortion occurring in the main amplifier.

As a construction for solving the above-described problem of input in excess, for example, a construction of adding a pre-distortor to the main amplifier is known. In this construction, it is intended to cancel the distortion that occurs in the main amplifier, by the distortion that is generated in the pre-distortor. By this cancellation, it is possible to approach the gain linearity (that the gain is linear) of the main amplifier or the phase flatness (that the phase of the output signal goes along a flat straight line) to an ideal state. It is thereby possible to improve the distortion compensation characteristic of the distortion-compensated amplifier device.

Here, in FIG. 9 there is illustrated an example of the circuit construction of the feed forward type distortion-compensated amplifier device that is equipped with the above-described pre-distortor. An example of the operation of this distortion-compensated amplifier device will be explained below with reference to this FIG. 9.

Namely, the signal that is input (to the distortion-compensated amplifier device) is distributed by a distributor 61. With respect to one distribution signal, vector adjustment is performed by a vector adjuster 62 and a distortion is generated by the pre-distortor (PD) 63. Thereafter, that one distributor signal is amplified by a main amplifier 64, and this amplification signal is output to a directional coupler 66. It is to be noted that, when performing such amplification, in the main amplifier 64, an amplitude distortion or a phase distortion is generated correspondingly to the level of the input signal thereto. With these distortions being contained in the amplification signal, this signal is output.

The other distribution signal that has been distributed by the distributor 61 is delayed by a delay line 65 and the signal is output to the directional coupler 66. It is to be noted that the amount of delay that is made by the delay line 65 is the same as that which is made by the vector adjuster 62, pre-distortor 63, and main amplifier 64.

In the directional coupler 66, part of the amplification signal from the main amplifier 64 is gotten by it. This partial amplification signal and the (other) distribution signal from the delay line 65 are composed in a state of having the same amplitude and opposite phases in regard to the input signal (the signal excluding the distortion component). Resultantly, the distortion component signal (ideally, the signal containing therein only the distortion component alone) that is thereby detected is output to a distributor 68. Also, in the directional coupler 66, the remaining portion of the amplification signal from the main amplifier 64 is output to a delay line 67, and this remaining portion amplification signal is output to a directional coupler 71 via the delay line 67. It is to be noted that the amount of delay that is made by the delay line 67 is the same as that which is made by the distributor 68, vector adjuster 69, and error amplifier 70.

In the distributor 68, the distortion component signal from the directional coupler 66 is distributed to it. With respect to one distributed distortion component signal, vector adjustment is performed by the vector adjuster 69 and, then, this one distortion component signal is amplified by the error amplifier 70. This amplification signal is output to the directional coupler 71.

In the directional coupler 71, the amplification signal (of the input signal) from the delay line 67 and the (distortion component) amplification signal from the error amplifier 70 are composed with the same amplitude and opposite phases in regard to the distortion component. The amplification signal (of the input signal) that has had its distortion component eliminated thereby is output (from the distortion-compensated amplifier device).

Also, in a control circuit 76, for example, the above-described vector adjuster 62 or the above-described pre-distortor 63 is controlled so that the compensation of the distortion (in the distortion-compensated amplifier device) may be optimized.

Specifically, regarding the vector adjuster 62, the level of the other distribution signal (the distortion component signal) that has been distributed by the distributor 68 is detected by a level detector 72. By an optimizing controller 77, the vector adjustment of the vector adjuster 62 is controlled so that this detected level may become minimum.

Also, regarding the pre-distortor 63, further, part of the signal that is input to the distributor 61 of the above-described distortion-detecting loop is gotten by a directional coupler 73. This partial signal has its level detected by a level detector 74, while the temperature (e.g. the temperature of the main amplifier 64 or its neighboring area) is detected by a temperature sensor 75. According to the detected level and temperature, the generation of the distortion from the pre-distortor 63 is controlled by an optimizing controller 78 so that the (distortion component) level detected by the level detector 74 may become minimum.

Incidentally, the input/output characteristic of the main amplifier 64 varies depending upon its input level (or output level). That's why the above-described detection of the level of the input signal by the level detector 74 and the above-described detection of the temperature by the temperature sensor 75 are performed. The input level and temperature are referred to in the optimizing controller 78 as the input parameter and temperature parameter.

An example of the compensation of the distortion performed by the pre-distortor 63 will now be described with reference to FIGS. 10(a) and 10(b).

In FIG. 10(a), there is illustrated by the symbol "P1" as an example of the relationship (the main amplifier characteristic) between the level (input level) of the signal that is input to the main amplifier 64 and the level (output level) of the signal that is output from the main amplifier 64. There is also illustrated by the symbol "P2" an example of the relationship (the characteristic that has been corrected by the pre-distortor) between the input and output levels that is obtained in case having corrected the non-linearity characteristic of the main amplifier by using the pre-distortor 63. Further, there is also illustrated in the dotted line by the symbol "P3" an example of the relationship (the ideal linearity characteristic) between the input and output levels that is obtained under the assumption that the main amplifier 64 has an ideal linearity characteristic.

As illustrated in FIG. 10(a), in the main amplifier 64, as the input level increases, the output level also increases. However, as the input power comes near to the saturation power of the amplification element, the gain gradually decreases as compared with the ideal linearity characteristic (AM-AM conversion). In contrast to this, the pre-distortor 63, which is constructed of, for example, a circuit for realizing a characteristic that is opposite to the input/output level characteristic of the main amplifier 64 (a characteristic that cancels this latter characteristic), may be disposed in a preceding stage to the amplifier 64. By this disposing, it is possible to approach the characteristic of the main amplifier 64 and that of the pre-distortor 63, as a whole, to an ideal output level characteristic.

Also, in FIG. 10(b), there is illustrated by the symbol "Q1" an example of the relationship (the main amplifier characteristic) between the level (input level) of the signal that is input to the main amplifier 64 and the phase (output phase) of the signal that is output from the main amplifier 64. And, there is illustrated by the symbol "Q2" an example of the relationship (the characteristic corrected by the pre-distortor) of the output phase with respect to the input level that is obtained when having corrected the non-linearity characteristic of the main amplifier 64 by the use of the pre-distortor 63. It is to be noted that the characteristic corrected by the pre-distortor, illustrated by the symbol "Q2" in FIG. 10(b) coincides with the relationship (ideal characteristic) of the output phase with respect to the input level that is exhibited under the assumption that the main amplifier 64 has an ideal linearity characteristic.

As illustrated in FIG. 10(b), in the main amplifier 64, it is ideal that even. when the input level increases, the output phase does not vary but is kept constant. However, actually, as the input level increases and the input power approaches to the saturation power of the amplification element that is being used, the output phase gradually gets deviated from an ideal flat straight line (AM-PM conversion). In contrast to this, the pre-distortor 63, which is constructed of, for example, a circuit for realizing a characteristic that is opposite to the characteristic of the output phase with respect to the input level of the main amplifier 64 (a characteristic that cancels this latter characteristic), may be disposed in a preceding stage to the main amplifier 64. By this disposition, it is possible to approach the characteristic of the main amplifier 64 and that of the pre-distortor 63, as a whole, to an ideal output-phase characteristic.

As illustrated using FIGS. 10(a) and 10(b), in the pre-distortor 63, there is generated a distortion that realizes the characteristic that is opposite to each of the input/output level characteristic (the amplitude-distortion characteristic) of the main amplifier 64 and the output-phase characteristic (the phase-distortion characteristic) with respect to the input, level. By doing so, it is possible to suppress the distortion that occurs in the main amplifier 64.

Also, as described above, in the main amplifier 64, it is possible that the gain linearity or the phase flatness that is exhibited during its operation will vary due to the relevant factors such as its input level (output level) or its literature. For this reason, there are performed the following operation. The operation of detecting the input or output level of the main amplifier, controlling according to this detected result the generation of distortion (the characteristic of the distortion) by the pre-distortor 63, and thereby correcting this distortion. The operation of detecting the temperature by the use of the temperature sensor, controlling according to this detected result the generation of distortion (the characteristic of the distortion) by the pre-distortor 63, and thereby correcting this distortion. Incidentally, it is for example possible in advance to measure or estimate the variation in characteristic of the output level or output phase as viewed with respect to the respective fluctuation factors. Thereby, it is also possible to control the pre-distortor 63 by the use of a memory table, or a temperature-compensation circuit, that stands on the basis of that measured result or estimated result.

Also, as a conventional circuit example wherein the distortion compensation of the pre-distortor and the distortion compensation performed with the feed forward control are combined together as described above, there is introduced here a pre-distortion automatically adjusting circuit that is described in Japanese Patent Application Laid-Open No. Hei-10-145161 (hereinafter referred to as "the first literature").

In FIG. 11, there is illustrated an example of the pre-distortion automatically adjusting circuit that is described in the above-described first literature. The circuit construction part illustrated in that figure corresponds to the above-described distortion-detecting loop and the part of the control circuit.

The outline of the operation is as follows. First, the input signal is distributed through the operation of a distributor 81. With respect to one distribution signal, a distortion is generated through the operation of a pre-distortion circuit 82. The amplitude of this signal is adjusted through the operation of a variable attenuator 83, and the phase of this signal is adjusted through the operation of a variable phase shifter 84. Thereafter, this one distribution signal is amplified through the operation of a main amplifier 85, and this amplification signal is output to a directional coupler 87. In this example, the pre-distortion circuit 82 corresponds to the pre-distortor, and the variable attenuator 83 and the variable phase shifter 84 paired therewith correspond to the vector adjuster.

Also, in the directional coupler 87, part of the amplification from the main amplifier 85 is gotten by it, and this partial amplification signal is output to an adder 88. On the other hand, the other distribution signal that has been distributed by the distributor 81 is output to the adder via a delay line 86. In the adder 88, these two signals are added together (composed) in a state of having the same amplitude and opposite phases in regard to the input signal (the signal excluding the distortion component). The distortion component signal that is thereby detected is subjected to wave detection by a wave detector 89.

And, in a control circuit 90, according to the detected result of the wave detector 89 there are controlled the pre-distortion circuit 82, the variable attenuator 83, and the variable phase shifter 84. Specifically, in the control circuit 90, the respective characteristics of the pre-distortion circuit 82, variable attenuator 83, and variable phase shifter 84 are adjusted so that the intensity of the distortion component signal input to the wave detector 89 may become minimum.

Also, in the above-described first literature, there is illustrated an example of the pre-distortion circuit, and it is described that this circuit is the one that has been cited from a book in that there is contained the description "Digital Wireless Communication (Chapter 6) by Muroya & Yamamoto".

According to the first literature, the pre-distortion system suits a rough compensation of distortion such as that for decreasing, for example, a distortion of −20 dB to a distortion of −30 dB, while the feed forward system suits a fine compensation of distortion such as that for decreasing, for example, a distortion of −30 dB to −60 dB. The literature described that, when combined together, the both systems are very effective.

However, in the distortion-compensated amplifier device that is equipped with, for example, the conventional pre-distortor such as that illustrated in the above-described FIG. 9 or FIG. 11, the pre-distortor, vector adjuster, etc. is certainly controlled through the operation of the control circuit. But no sufficient study and examination were made of the way of controlling.

SUMMARY OF THE INVENTION

The present invention has been made in view of the above-described conventional circumstances and has an object to provide a distortion-compensated amplifier device that, when compensating a distortion that occurs in the main amplifier by the use of a circuit comprised of a distortion-detecting loop and a distortion-compensating loop and a pre-distortor, enables excellently realizing the compensation of the distortion, and to provide a method of performing such compensation of the distortion.

To attain the above object, in a distortion-compensated amplifier device according to the present invention, when amplifying the signal by the use of the main amplifier, the distortion that occurs in the main amplifier is compensated as follows.

Namely, in the distortion-detecting loop, the signal is distributed. With respect to one distribution signal, vector adjustment is performed by vector adjuster means, and a distortion is generated by the pre-distortor. By doing so, the one distribution signal is amplified by the main amplifier, and, in addition, this amplification signal and the other distribution signal are composed, thereby detecting the distortion component contained in that amplification signal.

Here, in such a case where the vector adjustment of the vector adjustment means or the distortion generation of the pre-distortor are, for example, not controlled in an optimized state, the distortion component detected by the distortion-detecting loop inconveniently contains, for example, the following signal component. Namely, the input signal component (the component constituted by the other distribution signal) that has not been canceled by said composing and has inconveniently remained.

Also, in the distortion-compensating loop, the amplification signal from the main amplifier and the distortion component detected by the distortion-detecting loop are composed to thereby eliminate the distortion component from the amplification signal.

And, in the control part, according to the distortion component detected by the distortion-detecting loop there is controlled the generation of the distortion of the pre-distortor as well as the vector adjustment of the vector adjuster means.

Specifically, in the control part, its control is performed as follows. Namely, the distortion component level detecting means detects the level of the distortion component detected by the distortion-detecting loop. The vector adjustment control means controls the vector adjustment of the vector adjustment means so that the average value of the levels that are detected by the distortion component level detecting means may become minimum. And, the pre-distortor control means controls the generation of the distortion of the pre-distortor so that the peak values of the levels that are detected by the distortion component level detecting means may become minimum.

Accordingly, when controlling the vector adjustment of the vector adjustment means equipped in the distortion-detecting loop and the generation of the distortion of the pre-distortor, the control is performed as follows. Namely, vector adjustment is controlled according to the average value of the levels of the distortion component detected by the distortion-detecting loop, while, according to the peak values of the levels of that distortion component, the generation of the distortion of the pre-distortor is controlled. Therefore, it is possible to realize excellent compensation of the distortion, as a whole.

That is to say, ordinarily, in the amplifier (the main amplifier), the non-linearity characteristic thereof uprises as the input level approaches more to the saturation region thereof. Therefore, for example, when a signal, wherein instantaneous peak powers occur, is used in, or in the vicinity of, the saturation region, a signal that has high peaks at (, or in the vicinity of,) such peak powers is output as the distortion component signal detected by the distortion-detecting loop. Therefore, in the present invention, it is arranged to control the generation of the distortion of the pre-distortor so that such peak values may become small. It is thereby possible to cope with the occurrence of the instantaneous peak powers. Also, in the present invention, it is arranged to control the vector adjustment of the vector adjustment means so as to make small the average value of the levels of the distortion component signal. Thereby, it is also possible to cope with other signal portion, as well, than the instantaneous peak powers. Through the performance of these operations as a whole, in the present invention, it is possible to realize high precision compensation of the distortion.

Here, the signals that are to be processed by the distortion-compensated amplifier device according to the present invention may include various types of signals. For example, a multi-carrier signal, or a CDMA signal, or a multi-value QAM (Quadrature Amplitude Modulation) signal is suitable as such signals. Also, in the present invention, even with respect to, for example, a wide-band signal, excellent compensation of the distortion can be performed.

Also, the vector adjustment means is constructed of, for example, either one, or both, of a variable attenuator for adjusting the level of the signal and a variable phase shifter for adjusting the phase of the signal. It thereby performs either one, or both, of the adjustment of the level of the signal and the adjustment of the phase of the signal. And (either one, or both, of) these adjustments of the level and phase of the signal correspond to the vector adjustment that is referred to in the present invention.

Also, the pre-distortor may have any type of construction if, for example, it can generate, for example, a distortion (that has a characteristic opposite to that of the distortion that occurs in the main amplifier) with respect to the signal.

Also, the main amplifier may have any type of construction if, for example, it can amplify the signal.

Also, in the distortion-detecting loop, the sequential order in that with respect to the signal (one distribution signal) the vector adjustment of the vector adjustment means is performed and the generation of the distortion of the pre-distortor is performed may be arbitrary. That is, the present invention includes a construction wherein any sequential order is adopted. That is, in the distortion-detecting loop, for example, the distortion of the pre-distortor may be imparted after the vector adjustment means has performed vector adjustment with respect to the signal (one distribution signal). Or, for example, the vector adjustment means may perform vector adjustment after the pre-distortor has imparted the distortion to the signal (one distribution signal).

Also, in the distortion-detecting loop, the way of composing the amplification signal and the other distribution signal is preferably that these two signals are composed so that they may have the same amplitude (a state where the amplitudes are the same) and opposite phases (a state where the phases are 180° out of phase) in regard to the other distribution signal (other signal portion than the distortion component). By this composing, it is possible to detect (only) the distortion component. Here, making low the level of the distortion component detected by the distortion-detecting level is to make small, for example, the input signal component (the other distribution signal component) that with said composing cannot be canceled and that resultantly remains in that distortion component and is inconveniently contained therein. It is to be noted that, if, for example, to an extent by which effective distortion compensation can be practically realized, the composing may be performed in a state having been deviated from the above-described state where said two signals have the same amplitude or opposite phases.

Similarly, in the distortion-compensating loop, the way of composing the amplification signal and the distortion component is preferably that these two signals are composed so that they may have the same amplitude (a state where the amplitudes are the same) and opposite phases (a state where the phases are 180° out of phase) in regard to the distortion component. As a result of this, it is possible to get (only) the signal that has been amplified (and that is other than the distortion component). It is to be noted that, if, for example, to an extent by which effective distortion compensation can be practically realized, the composing may be performed in a state having been deviated from the above-described state where those two signals have the same amplitude or opposite phases.

Also, the extent by which in the distortion-compensating loop to eliminate the distortion component from the amplification signal is preferably that, for example, the whole distortion component contained in this amplification signal is eliminated. However, if to a practically effective extent, a mode in which (only) part of the distortion component contained in the amplification signal is eliminated, for example, may be used. The point is only that the distortion component contained in the amplification signal is decreased.

Also, the level that is detected by the distortion component level detecting means may be any value of level. Therefore, it is possible, for example, to detect the level of the amplitude of the distortion component, the level of the power (that usually is proportionate to the square of the amplitude) of the distortion component, etc.

Also, as the way of controlling so that the average value or the peak value may become small as so referred to in the present invention, it is preferable to arrange, for example, so that that average value or peak value may become minimum. However, if to a practically effective extent, the control may be performed, for example, in other mode (i.e. a mode in which such value is not minimum).

Also, the mode in which to perform control so that the average value of the levels detected by the distortion component level detecting means may become small includes, for example, the one in which to perform control so that the integrated value of those levels may become small. Namely, that such integrated value becomes small means that the average value that has been obtained by dividing that integrated value by the integrating length of time becomes small.

Also, the mode in which to perform control so that the peak value of the levels detected by the distortion component level detecting means may become small includes not only the mode in which to detect the peak value and to control so that this detected value may become small, but also the mode in which to detect, for example, the level value in the vicinity of that peak value and to control so that this detected value may become small. That is, even if there is not always detected the peak value itself, it is possible to make the peak value small, for example, by detecting the level value in the vicinity of the peak value.

Also, the mode in which to control the vector adjustment of the vector adjustment means includes, for example, the one in which to control either one of the amplitude adjustment and the phase adjustment of the signal, or the mode in which to control the both of them.

Similarly, the mode in which to control the generation of the distortion of the pre-distortor includes, for example, the one in which to control either one of the amplitude and the phase of the distortion signal generated, or the mode in which to control the both of them.

Also, in the distortion compensating amplifier device according to the present invention, as a preferable mode, the vector adjustment controlling means controls the vector adjustment means so that, of the levels detected by the distortion component level detecting means, the levels the values of that are smaller than a prescribed value may have their average value made small.

Accordingly, for example, the level of the above-described levels at the times when the peaks thereof appear has its value set to be a prescribed value. And, by this setting, the level portions that are other than those at around the times when the peaks appear have their average value determined, and, according to this average value, vector adjustment can be controlled. As a result of this, excellent control can be performed.

Also, in the distortion-compensated amplifier device according to the present invention, as a preferable mode, the pre-distortor controlling means controls the generation of the distortion of the pre-distortor so that, of the levels detected by the distortion component level detecting means, the levels the peak values of that are equal to greater than a prescribed value may have their average value made small.

Accordingly, the generation of the distortion of the pre-distortor can be controlled according to the average value of the peak values each of that is equal to greater than the prescribed value. As a result of this, excellent control can be performed.

Here, as the above-described prescribed value used in the vector adjustment controlling means and the above-described prescribed value used in the pre-distortor controlling means, various values may be used. However, as one example, as those two prescribed values, it is also preferable that the same value be used. In this case, this prescribed value serves as a threshold value for determining whether the relevant level values are the peak values.

Also, in the distortion-compensated amplifier device according to the present invention, as one mode, in its control part, the peak detecting means detects that the peak values of the levels detected by the distortion component level detecting means have exceeded a prescribed threshold value. And, the pre-distortor controlling means controls the generation of the distortion of the pre-distortor correspondingly to the fact that detection has occurred in the peak detecting means.

Accordingly, (only) when the peak values of those levels have exceeded the above-described prescribed threshold value, the generation of the distortion of the pre-distortor is controlled. Therefore, it is possible to realize the way of operation in which control is, for example, performed (only) when the necessity arises.

Here, as the prescribed threshold value, various values may be used.

Also, no particular limitation is imposed upon the way of detecting that the peak values of those levels have exceeded the prescribed threshold value. It includes, for example, the way of detecting in which to detect the peak values of those levels and to compare those peak values and the prescribed threshold value in respect of their magnitude to thereby detect that, or, for example, the way of detecting in which to at all times monitor (e.g. periodically) and to compare these level values and the prescribed threshold value in respect of their magnitude to thereby detect that, etc.

Also, regarding the control performed of the vector adjustment of the vector adjuster means, for example there may be used a mode in which that control is (at all times) performed irrespective of the detected result of the above-described peak detecting means, or, for example, there may be used a mode in which that control is performed (only) when detection has occurred in that peak detecting means.

Also, in the distortion-compensated amplifier device according to the present invention, as another mode, in its control part, the average peak detecting means detects that, regarding the levels detected by the distortion component level detecting means, the average value of the peak values thereof that are equal to or greater than a prescribed value have exceeded the prescribed threshold value. And, the pre-distortor controlling means controls the generation of the distortion of the pre-distortor correspondingly to the fact that detection has occurred in the average peak detecting means.

Accordingly, (only) when the average value of the peak values equal to or greater than the prescribed value has exceeded the above-described prescribed threshold value, the generation of the distortion of the pre-distortor is controlled. Therefore, it is possible to realize the way of operation in which control is, for example, performed (only) when the necessity arises.

Here, as the prescribed threshold value, various values may be used.

Also, regarding the control performed of the vector adjustment of the vector adjuster means, for example there may be used a mode in which that control is (at all times) performed irrespective of the detected result of the above-described average peak detecting means. Also, for example, there may be used a mode in which that control is performed (only) when detection has occurred in that average peak detecting means.

Also, in the distortion-compensated amplifier device according to the present invention, as a preferred mode, at least either one of the pre-distortor controlling means and the vector adjustment controlling means has main amplifier level detecting means for detecting the level of the signal amplified by the main amplifier and temperature detecting means for detecting the temperature. It also has a memory in that there are stored the following control condition information in a state of its being in correspondence with control values for performing the control. The control condition information includes information that regards the values based on the levels detected by the distortion component level detecting means, the levels detected by the main amplifier level detecting means, and the temperature detected by the temperature detecting means. Thereby, the control values corresponding to the control condition information that is gotten are read out from the memory, and, by the use of those control values, the control is performed.

Accordingly, because the control of the pre-distortor or vector adjustment means is performed using the control condition information and control values stored in the memory that are in the above-described correspondence with each other, for example a simple, quick control can be performed.

Here, the above-described way of controlling may be used in, for example, either one of the pre-distortor controlling means and the vector adjustment controlling means, or, in each of them.

Also, in case the above-described way of controlling is used in each of the pre-distortor controlling means and vector adjustment controlling means, the main amplifier level detecting means or temperature detecting means can be equipped as means common to each of those two former means. In addition, for example, the control condition information also can be made to be information common to each of them.

Also, as the way of detecting the level of the signal amplified in the main amplifier through the operation of the main amplifier level detecting means, there can be used the way of detecting, for example, the level of the signal input to the main amplifier, or, the way of detecting, for example, the level of the signal output from the main amplifier. Also, the construction for this is not always limited to the one for directly detecting the input/output level of the main amplifier. For example, there can be used a construction such as, for example, that wherein other circuit elements are used between the main amplifier and the main amplifier level detecting means to thereby indirectly detect the input/output level of the main amplifier.

Also, no particular limitation is imposed upon the way of detecting the temperature through the operation of the temperature detecting means. However, preferably, there is used, for example, the way of (directly) detecting the temperature of the main amplifier or for example the way of detecting the temperature at places that enables estimating the temperature of the main amplifier.

Also, as the value that is based on the levels detected by the distortion component level detecting means, there is, for example regarding the pre-distortor controlling means, the peak values of such levels, or the average value of the peak values, equal to or greater than a prescribed value, of such levels. Further, there is, for example regarding the vector adjustment controlling means, the average value of such levels, or the average value of the levels, smaller than the prescribed value, of such levels.

Also, the control condition information may be the one that reflects states other than, for example, the values based on the levels detected by the distortion component level detecting means, the levels detected by the main amplifier level detecting means, and the temperature detected by the temperature detecting means. For example, it may be information that reflects environmental states such as the power source voltage of the main amplifier.

Also, as the control value, there is used, for example, the one for controlling the pre-distortor means or the one for controlling the vector adjuster means. Or, there may be used common control values for controlling both of those means.

Also, the present invention provides a distortion-compensated amplification method that has the same characterizing features as those involved in the above-described technical idea of the distortion-compensated amplifier device.

Namely, in the distortion-compensated amplification method according to the present invention, the signal is distributed. With respect to one distribution signal, vector adjustment is performed and a distortion is generated. Then, this one distribution signal is amplified by the main amplifier. Then, this amplification signal and the other distribution signal are composed, thereby detecting a distortion component contained in that amplification signal. On the other hand, the amplification signal from the main amplifier and the distortion component detected are composed, thereby eliminating the distortion component from that amplification signal. At this time, in case controlling the vector adjustment and the generation of the distortion according to the distortion component detected, vector adjustment is controlled so that the average value of the levels of the distortion component detected may become small, and generation of the distortion is controlled so that the peak values of those levels may become small.

DETAILED DESCRIPTION OF THE PREFERRED EMBODIMENTS

An embodiment of the present invention will now be explained with reference to the drawings.

It is to be noted that in this embodiment a distortion-compensated amplifier device according to the present invention will be explained by way of example, and that, by doing so, a method of performing distortion-compensated amplification according to the present invention will be explained together therewith.

Figure 1:
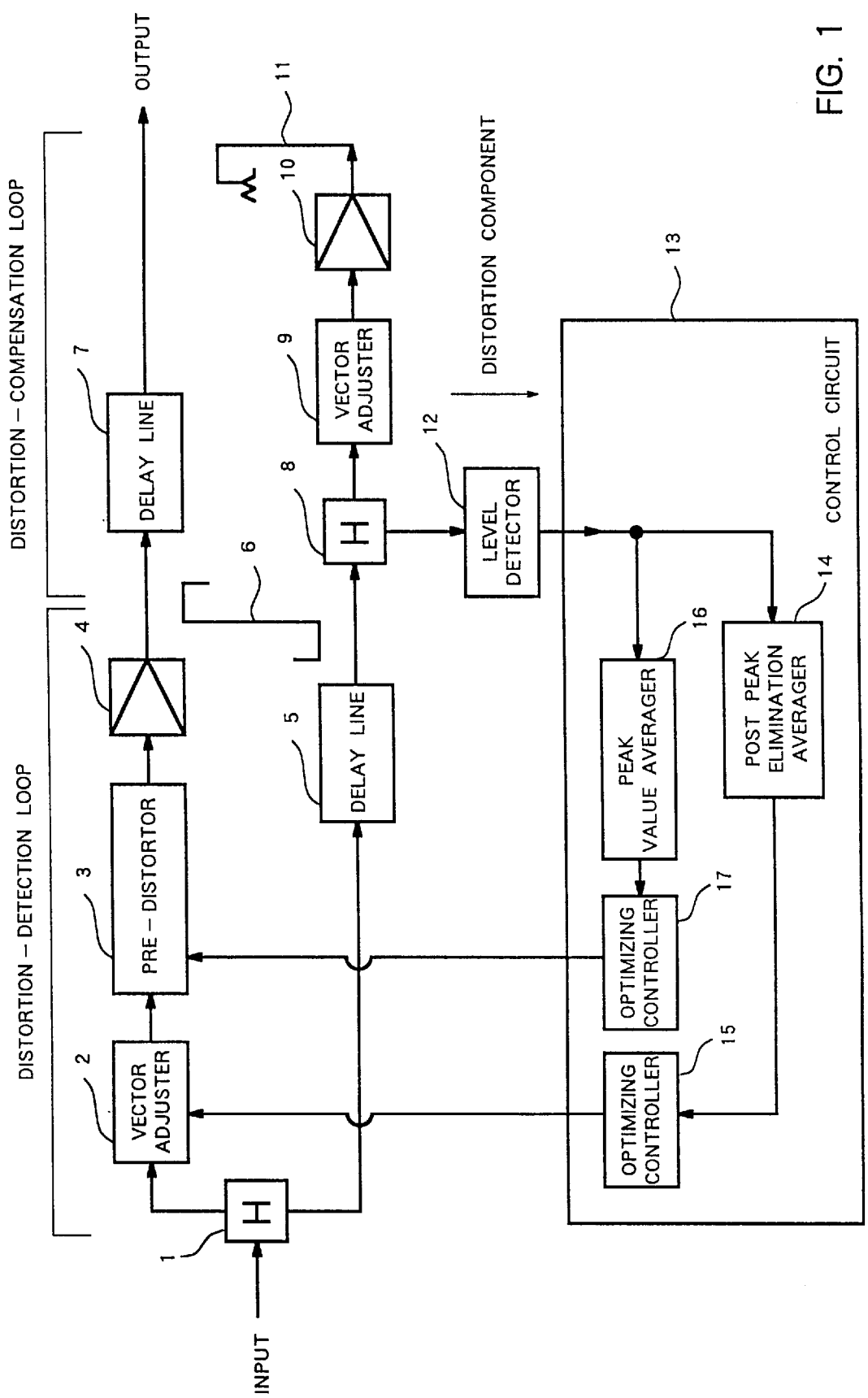
FIG. 1 is a view illustrating an example of the circuit construction of a distortion-compensated amplifier device according to the present invention.

In FIG. 1, there is illustrated an example of the circuit construction of the distortion-compensated amplifier device according to the present invention. This distortion-compensated amplifier device is constructed of a distortion-detecting loop, a distortion-compensating loop, and a control part. When amplifying the signal by a main amplifier 4, feed forward control is performed to thereby perform distortion compensation, and distortion compensation is also performed through the use of a pre-distortor 3.

The distortion-detecting loop is equipped with a distributor 1, a vector adjuster 2, the pre-distortor 3, the main amplifier 4, a delay line 5, and a directional coupler 6.

Also, the distortion-compensating loop is equipped with a delay line 7, a distributor 8, a vector adjuster 9, an error amplifier 10, and a directional coupler 11.

Also, the control part is equipped with the distributor 8, a level detector 12, and a control circuit 13. Also, the control circuit 13 is equipped with a post peak elimination averager 14, an optimizing controller 15 for controlling the vector adjuster 2, a peak value averager 16, and an optimizing controller 17 for controlling the pre-distortor 3.

The distributor 1 performs distribution of a signal that is input (to the distortion-compensated amplifier device). The distributor 1 outputs one distribution signal to the vector adjuster 2 and outputs the other distribution signal to the delay line 5.

The vector adjuster 2 is constructed of, for example, a variable attenuator, a variable phase shifter, etc. By being controlled by the optimizing controller 15 as later described, the vector adjuster 2 adjusts the amplitude, or the phase, of the signal input from the distributor 1. Thereafter, the vector adjuster 2 outputs this signal to the pre-distortor 3.

The pre-distortor 3 is controlled by the optimizing controller 17 as later described. Thereby, the pre-distortor 3 generates a distortion, which has a prescribed amplitude or a prescribed phase, with respect to the signal that is input from the vector adjuster 2. The vector adjuster 2 outputs this signal (including the distortion as well) to the main amplifier 4.

Figure 2:
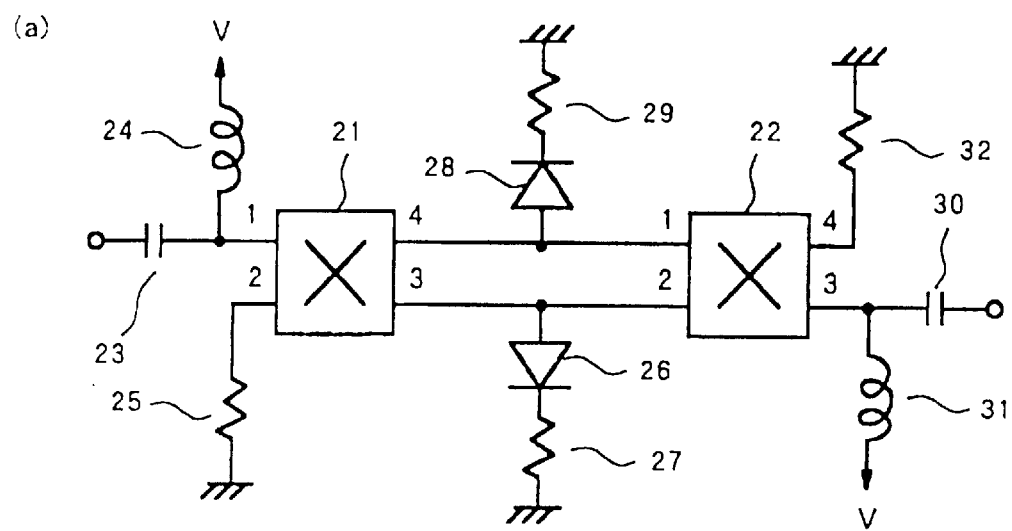
FIGS. 2(a), 2(b), and 2(c) each are a view illustrating an example of the circuit construction of a pre-distortor.
Figure 2:
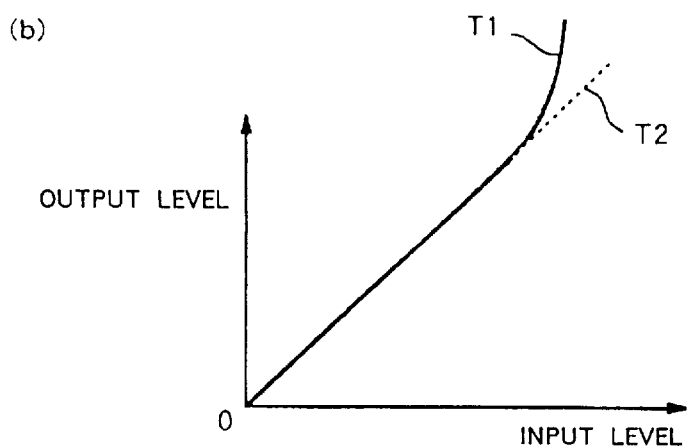
Figure 2:
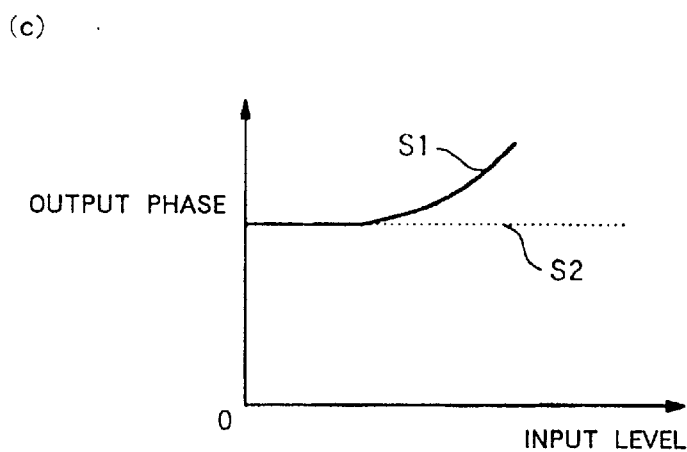

Here, FIG. 2(a) illustrates an example of the circuit construction of the pre-distortor 3. This pre-distortor 3 is constructed of two 3 dB-couplers 21 and 22 each of that has four terminals (from a first to a fourth terminal).

More specifically, to the first terminal of the first 3 dB-coupler 21 there is connected via a capacitor 23 an input end of a signal (that is to be processed by the pre-distortor 3). Between the first terminal and the capacitor 23 there is connected via a coil 24 a voltage source (voltage V).

Also, to the second terminal of the first 3 dB-coupler 21 there is connected via a resistor 25 a ground source.

Also, the third terminal of the first 3 dB-coupler 21 and a second terminal of the second 3 dB-coupler 22 are connected to each other. Between these two terminals there is connected via a diode 26 and a resistor 27 the ground source. It is to be noted that the diode 26 is connected in a state of having been directed in a direction to cause a current to flow toward the ground source.

Also, the fourth terminal of the first 3 dB-coupler 21 and a first terminal of the second 3 dB coupler 22 are connected to each other. Between these two terminals there is connected via a diode 28 and a resistor 29 the ground source. It is to be noted that the diode 28 is connected in a state of having been directed in a direction to cause the current to flow toward the ground source.

Also, to a third terminal of the second 3 dB-coupler 22 there is connected via a capacitor 30 an output end of a signal that is to be processed by the pre-distortor 3). Between the third terminal and the capacitor 30 there is connected via a coil 31 a voltage source (voltage V).

Also, to a fourth terminal of the second 3 dB-coupler 22 there is connected via a resistor 32 the ground source.

In the pre-distortor 3 having the above-described circuit construction, utilizing the non-linearity of the diode, it is possible to generate a distortion that has a prescribed amplitude or a prescribed phase. Specifically, by varying the operating current, or the operating point, of the diodes 26 and 28, it is possible to vary the characteristic of the gain (amplitude), the characteristic of the phase, of the distortion signal that is generated. It is to be noted that, as such a pre-distortor 3, as an example, it is possible to construct it by utilizing the "distortion compensation device" that is described in Japanese Patent Application Laid-Open No. Hei-11-046059.

Also, in FIG. 2(b), there is illustrated by the symbol T1 an example of the relationship between the level (the input level) of a signal that is input to the pre-distortor 3 and the level (the output level) of a signal that is output from the pre-distortor 3. Also, there is illustrated in a dotted line by the symbol T2 an example of the ideal characteristic of the input/output level that is obtained when the amplitude distortion generated in the main amplitude 4 has been canceled by the amplitude distortion that is generated from the pre-distortor 3. Here, the abscissa axis in the same figure (b) represents the input level and the ordinate axis represents the output level.

Also, in FIG. 2(c), there is illustrated by the symbol S1 an example of the relationship between the level (the input level) of a signal that is input to the pre-distortor 3 and the phase (the output phase) of a signal that is output from the pre-distortor 3. Also, there is illustrated in a dotted line by the symbol S2 an example of the ideal output-phase characteristic (with respect to the input level) that is obtained when the phase distortion generated in the main amplitude 4 has been canceled by the phase distortion that is generated from the pre-distortor 3. Here, the abscissa axis in the same figure (c) represents the input level and the ordinate axis represents the output phase.

The main amplifier 4 amplifies the signal input from the pre-distortor 3 to a desired level, and outputs this amplification signal to the directional coupler 6. It is to be noted that, in the main amplifier 4, when amplifying the signal, distortion occurs for example in such a case where the level of the input signal (the level of the output signal) is high.

The delay line 5 delays the signal input from the distributor 1 and outputs this signal to the directional coupler 6. Here, as the delay time of the delay line 5, a length of time after the lapse of that the following two timings coincide with each other is set for example. One is the timing at which said other distribution signal is output from the delay line 5 to the directional coupler 6. The other is the timing at which said one distribution signal is output to the directional coupler 6 via the vector adjuster 2, pre-distortor 3, and main amplifier 4.

The directional coupler 6 gets part of the amplification signal that is input from the main coupler 4. It thereby composes this partial amplification signal and the other distribution signal input from the delay line 5 so that, for example, the former signal may be the same in amplitude and opposite in phase with respect to the latter signal (input signal: said other distribution signal). It thereby outputs the distortion component (the distorted component contained in the amplification signal) that is detected as the composed result, to the distributor 8. Also, the directional coupler 6 outputs to the delay line 7 the remaining portion of the amplification signal that is input from the main amplifier 4.

Figure 3:
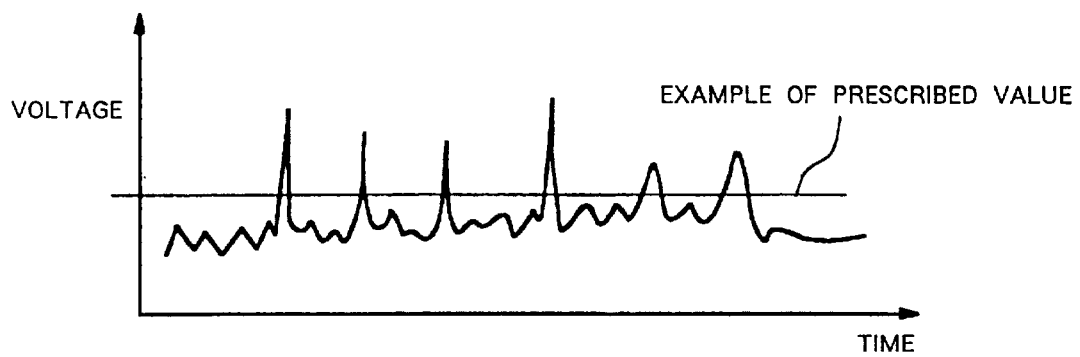
FIG. 3 is a view illustrating an example of the distorted component detected by a distortion-detecting loop.

Here, in FIG. 3, there is illustrated an example of the distortion component (in this embodiment the level of the distortion component that is detected by the level detector 12 as later described) that is detected by the distortion-detecting loop. In this FIG. 3, the abscissa axis represents the time and the ordinate axis represents the voltage (the level of the amplitude voltage) of the distortion component. As illustrated in the figure, in case for example performing processing the signal having peak powers instantaneously generated by the distortion-compensated amplifier device, instantaneous peaks appear in the distorted component that is detected by the distortion-detecting loop.

In other words, the peaks that are generated in the distortion component that is detected in the distortion-detecting loop are attributable to the non-linearity of the main amplifier 4. In this embodiment, as later described, the gain correction characteristic and the phase correction characteristic of the pre-distortor 3 are varied so that the values of such peaks may become small. In addition, for the same purpose, there is simultaneously performed a feed forward control based on the use of the distortion-detecting loop and the distortion-compensating loop. It is thereby possible to at all times control each of the feed forward distortion compensation circuit and the pre-distortor 3 to an optimum state of operation and to maintain it in this controlled state.

The delay line 7 delays the amplification signal that is input from the directional coupler 6 and outputs it to the directional coupler 11. Here, as the delay time of the delay line 7, a length of time after the lapse of that the following two timings coincide with each other is set for example. One is the timing at which the amplification signal is output from the delay line 7 to the directional coupler 11. The other is the timing at which the distortion component signal is output to the directional coupler 11 via the distributor 8, the vector adjuster 9, and an error amplifier 10.

The distributor 8 distributes the distorted-component signal that is input from the directional coupler 6. It outputs one distribution signal to the vector adjuster 9, and outputs the other distribution signal to the level detector 12.

The vector adjuster 9 adjusts the amplitude, or the phase, of the distortion component signal that is input from the distributor 8 and outputs this distortion component signal to the error amplifier 10. Incidentally, in this embodiment, although any illustrations and detailed explanations are omitted, when performing vector adjustment by the vector adjuster 9 of the distortion-compensating loop, as well, it is possible to control (by the control part) so that, for example, the level of the distortion component, contained in the amplification signal output from (the directional coupler 11 equipped to) the present distortion-compensated amplifier device, may become small (preferably, minimum).

The error amplifier 10 amplifies to a desired level the distortion component signal that is input from the vector adjuster 9, and outputs this amplification signal to the directional coupler 11.

The directional coupler 11 composes the amplification signal of the main amplifier 4 that is input from the delay line 7 and the amplification signal, constituted by the distortion component signal, that is input from the error amplifier 10 (so that, for example, the former may be the same in amplitude as and opposite in phase to the latter distortion component signal). It thereby outputs (from the present distortion-compensated amplifier device of this embodiment) the signal detected as the synthesized result (the amplification signal of the main amplifier 4 that has had its distortion component eliminated).

The level detector 12 performs wave detection of the distortion component signal that is input, for example, from the distributor 8. It thereby detects the level of this distortion component signal (the level of the distortion component). It then outputs this detected result to the post peak elimination averager 14 and to the peak value averager 16.

The post peak elimination (values) averager 14 detects the peaks, regarding the levels of the distortion component input from the level detector 12, which for example are equal to or greater than a prescribed value. And it detects an averaged value of the remaining level portions after the levels of the distortion component have had their detected peak portions eliminated therefrom (i.e. the averaged value of those level portions the values of that are smaller than the prescribed value). It then outputs this averaged value to the optimizing controller 15.

The optimizing controller 15 operates according to the averaged value that is input from the post peak elimination averager 14. And it controls the vector adjustment (the amplitude adjustment or the phase adjustment of the signal) made by the vector adjuster 2, so that for example that averaged value may become small (preferably, minimum).

The peak value averager 16 detects the peaks, regarding the levels of the distortion component input from the level detector 12, which for example are equal to or greater than a prescribed value. And it detects an averaged value of the detected-peak values. It then outputs this averaged value to the optimizing controller 17.

The optimizing controller 17 operates according to the averaged value that is input from the peak value averager 16. And it controls the generation of the distortion (the amplitude or the phase of the distortion) by the pre-distortor 3 so that for example that averaged value may become small (preferably, minimum).

Here, in this embodiment, the same value is used as the prescribed value used in the post peak elimination averager 14 and the one used in the peak value averager 16. An example of this prescribed value is illustrated in the FIG. 3 above referred to. Namely, the portions at that the levels of the distorted component are equal to or higher than the prescribed value are determined as the peaks, while the portions at that those levels are under the prescribed value are determined as the ones that are not the peaks.

Also, the length of time for averaging that is performed by the post peak elimination averager 14 or the peak value averager 16 is not particularly limited. If that length of time is around a value that for example would enable the realization of a practical, effective compensation of the distortion, that may be set to various lengths of time.

It is to be noted that, for example, in the "Feed-forward Distortion Compensated Amplifier Device and Distortion Compensated Amplification Method" described in Japanese Patent Application Laid-Open No. Hei-11-241206, as in the case of this embodiment, there are executed the following process, etc. The process is to detect a distorted-component signal that is extracted through the operation of the distortion-detecting loop and, thereby, to determine whether the level (amplitude) of this distortion component signal is greater than a prescribed threshold value. In addition, in that literature, there are also described a technique of performing sampling when executing such process, etc.

Figure 4:
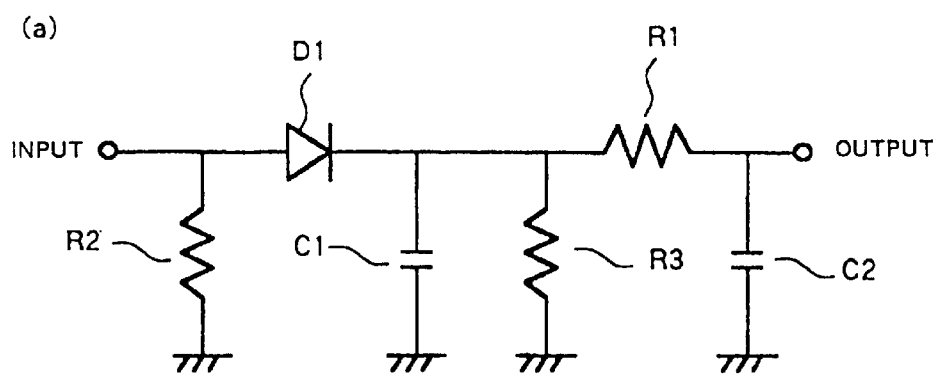
FIGS. 4(a), 4(b), and 4(c) each are a view illustrating an example of the average value detecting circuit.
Figure 4:
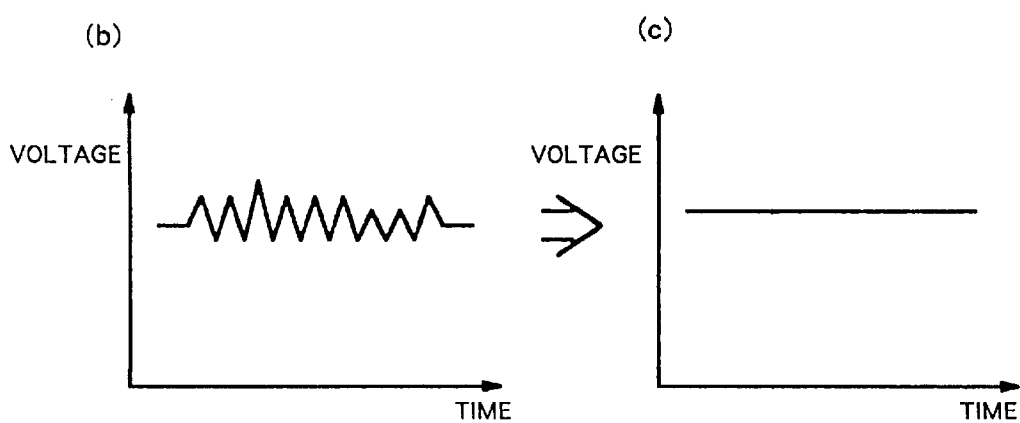

Here, as a concrete example of an analog, or similar-to-this, circuit, in FIG. 4(*a*), there is illustrated an example of an average value detecting circuit for detecting the average value of the levels of the signal. On the other hand, in FIG. 5, there is illustrated an example of a peak value detecting circuit for detecting the peak values of the levels of the signal.

In more detail, the average value detecting circuit illustrated in FIG. 4(*a*) is constructed in such a form wherein a diode D1 and a resistor R1 are connected to each other between the input end and the output end of the signal. And, to an input end of the diode D1 there is connected via a resistor R2 a ground source. To an output end of the diode D1, there is connected on this diode D1 side via a capacitor C1 a ground source and there is connected on the resistor R1 side via a resistor R3 a ground source. To an output end of the resistor R1 there is connected via a capacitor C2 a ground source. It is to be noted that the diode D1 is connected in a state of having been directed in a direction to cause a current to flow from the input end of this average value detecting circuit to the output end thereof.

Assume that, in this average value detecting circuit, for example, as illustrated in FIG. 4(*b*), there be the circumstances where, with respect to the time, a signal the voltage (the level of the amplitude voltage) of that fluctuates is input from the input end and is applied to the resistor R3. Then, as illustrated for example in FIG. 4(*c*), the average value detecting circuit can average such signal, and this circuit can output the average signal (the averaged value) from the output end via the resistor R1. In other words, the position of the resistor R3 is a terminal end for the wave detection, and the resistor R1 and the capacitor C2 constitute a filter for performing averaging. Here, the abscissa axis in each of FIGS. 4(*b*) and (*c*) represents the time, and the ordinate axis represents the voltage (the level of the amplitude voltage).

Incidentally, as the above-described diode D1, there can be used, for example, a Schottky-barrier type diode. Also, according to, for example, the input level or the diode, there is a case where it is preferable that the diode be used after a bias is applied.

Also, as the above-described capacitor C1, for example, a bypass capacitor is used. It is preferable that the capacitor the impedance (e.g. several $\Omega$) of that is sufficiently small with respect to the frequency thereof be used.

Also, for example, in the control circuit 13, in a case where the resistor R1 is connected to a high-impedance IC (Integrated Circuit) such as an A/D (Analog/Digital) converter, it is preferable that as that resistor R1 for example the one that is around 10 k$\Omega$ or so be used.

Also, as the above-described resistor R2, it is preferable that for example the one that is around 50 $\Omega$ be used.

Figure 5:
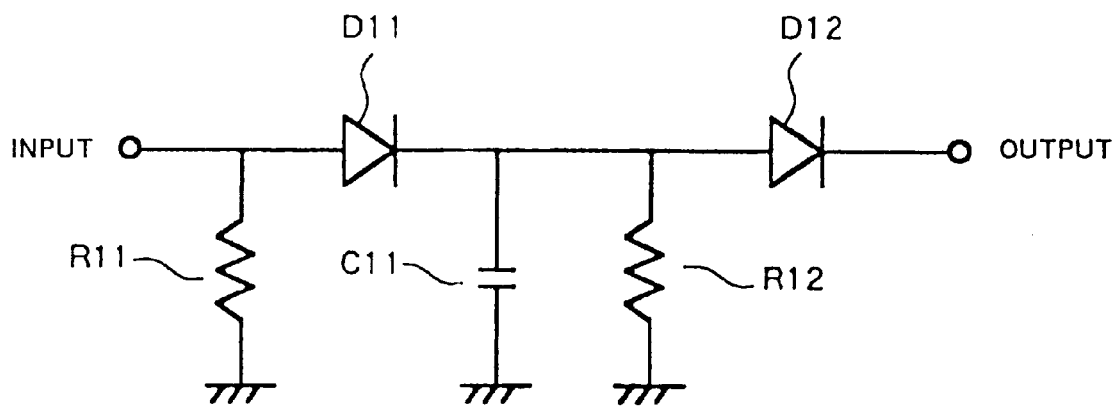
FIG. 5 is a view illustrating an example of the peak value detecting circuit.

Also, in more detail, the peak value detecting circuit illustrated in FIG. 5 is constructed in such a form wherein two diodes D11 and D12 are connected in series to each other between the input end and the output end of the signal. And, to an input end of the diode D11 on the input end side of signal there is connected via a resistor R11 a ground source. To an output end of the diode D11, there is connected on this diode D11 side via a capacitor C11 a ground source. Simultaneously, on the diode 12 side of the output end side of signal, there is connected via the resistor R12 via a ground source. It is to be noted that the diodes D11 and D12 each are connected in a state of having been directed in a direction to cause a current to flow from the input end of this peak value detecting circuit to the output end thereof.

Namely, the peak value detecting circuit illustrated in FIG. 5 has a construction wherein the portion, comprised of the resistor R1 and the capacitor C2, constituting the average value detecting circuit illustrated in FIG. 4(*a*) has been replaced with the diode D12 (e.g. a Schottky-barrier type diode). As a result of this, it is possible to get (hold) the peak values at the portion comprised of the resistor R12 and the diode D12.

In the above-described post peak elimination averager 14, as one example, regarding the levels of the distortion component, the average value detecting circuit performs averaging of the remaining level portion constituting those levels having had the peak portion eliminated therefrom. By doing so, it is possible to detect the average value of this level portion.

Also, in the above-described peak value averager 16, as one example, peak value detecting circuit detects the peak value of the levels of the distortion component, and the average value detecting circuit performs averaging of the peak value. By doing so, it is possible to detect the average value of the peak value.

Figure 6:
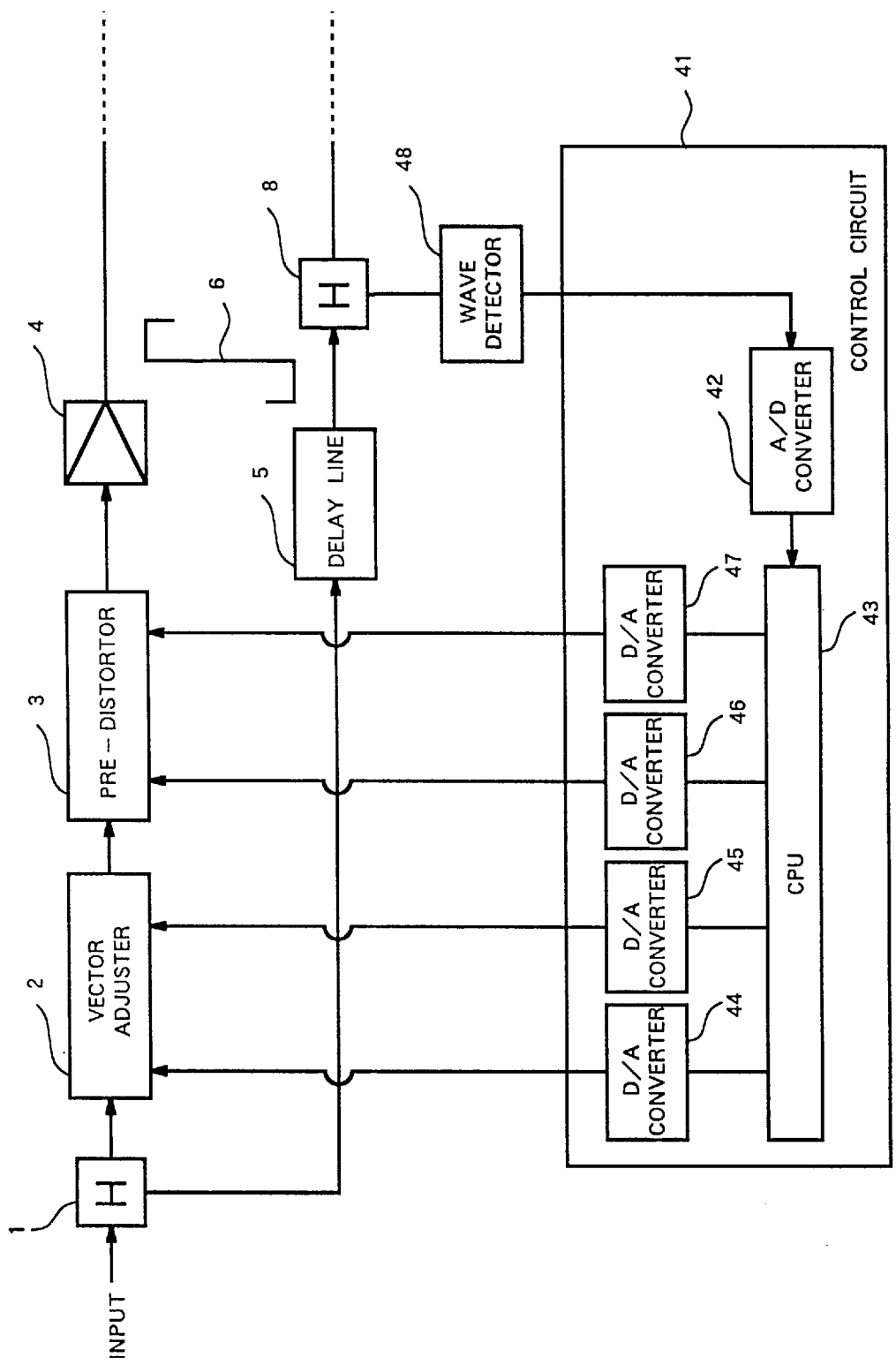
FIG. 6 is a view illustrating an example of the control circuit.

Also, in FIG. 6, there is illustrated an example of a control part that has a control circuit 41 (one corresponding to the above-described control circuit 13) that is constructed of, for example, digital circuits. Incidentally, this FIG. 6 also illustrates the distributor 1, vector adjuster 2, pre-distortor 3, main amplifier 4, delay line 5, directional coupler 6, and distributor 8 that respectively are the same as the ones illustrated in FIG. 1.

The control circuit 41 illustrated in FIG. 6 is equipped with an A/D converter 42 for converting an analog signal to a digital signal, a CPU (Central Processing Unit) 43, and four D/A (Digital/Analog) converters 44 to 47 each for converting a digital signal to an analog signal. Between the distributor 8 and the control circuit 41, there is disposed a wave detector 48 that for example performs wave detection of the distortion component signal that is detected by the distortion-detecting loop.

The wave detector 48 performs wave detection of the distortion component signal that is input from the distributor 8, and outputs this wave-detected result to the A/D converter 42.

The A/D converter 42 performs digital sampling (digitization) of the distortion component that is detected by the wave detector 48, and outputs this sampled result to the CPU 43.

And, the CPU 43, according to the sampled result input from the A/D converter 42, averages the distortion component levels excluding the peak portion the levels of that are equal to or greater than a prescribed value. It then according to this averaged result controls the vector adjuster 2 that is equipped in the distortion-detecting loop. It thereby makes that averaged result small (preferably minimum). It thereafter averages the peak values the levels of that are equal to or greater than a prescribed value. It thereby controls the pre-distortor 3 according to this averaged result and thereby makes the averaged result small (preferably minimum).

Incidentally, the CPU 43 outputs a control value for controlling, for example, the amplitude adjustment (in this embodiment a variable attenuator) that is performed by the vector adjuster 2, to the vector adjuster 2 (in this embodiment a variable attenuator) via the D/A converter 44. Simultaneously, it outputs a control value for controlling, for example, the phase adjustment (in this embodiment a variable phase shifter) that is performed by the vector adjuster 2, to the vector adjuster 2 (in this embodiment a variable phase shifter) via the D/A converter 45. It thereby controls the amplitude adjustment and the phase adjustment of the signal that are performed by the vector adjuster 2.

Also, the CPU 43 outputs a control value for controlling, for example, the amplitude of the distortion generated by the pre-distortor 3, to the pre-distortor 3 via the D/A converter 46. Simultaneously, it outputs a control value for controlling the phase of the distortion generated by the pre-distortor 3, to the pre-distortor 3 via a D/A converter 47. It thereby controls the amplitude and phase of the distortion that is generated by the pre-distortor 3.

Incidentally, the pre-distortor 3 for example may convert an input signal having a high frequency to a signal having a low frequency to thereby perform digital sampling. After having performed shaping the waveform of this signal by digital signal processing, it then may convert this signal (again) to a signal having a high frequency. Even when the pre-distortor 3 having this construction is used as the pre-distortor 3, the way of controlling as in this embodiment effectively functions.

As described above, the distortion-compensated amplifier device of this embodiment has a construction having the feed forward distortion compensating circuit performing distortion compensation through feed forward control by the use of the distortion-detecting loop and the distortion-compensating loop and the pre-distortor 3 in combination. In this construction, it controls the feed forward distortion compensating circuit (the vector adjuster 2) according to the average value regarding the distorted component that is detected by the distortion-detecting loop. On the other hand, it controls the pre-distortor 3 according to the peak values regarding this distorted component.

Accordingly, in the distortion-compensated amplifier device according to this embodiment, it is possible to control the above-described feed forward distortion compensating circuit and the above-described pre-distortor 3, respectively, according to the values that suit them. For this reason, it is possible to realize excellent compensation of the distortion. Thereby, even in a case where, for example, the variation in the characteristic of the main amplifier 4 or the pre-distortor 3 inconveniently occurs, the deterioration of the amount of distortion-compensated can be prevented. It is thereby possible to output an always-stabilized amplification signal (from the distortion-compensated amplifier device of this embodiment).

Here, in this embodiment, the function of the vector adjuster 2 constitutes the vector adjusting means that is so referred to in the present invention. The pre-distortor 3 corresponds to the pre-distortor that is so referred to in the present invention. And, the main amplifier 4 corresponds to the main amplifier that is so referred to in the present invention.

Also, in this embodiment, the function of the level detector 12 constitutes the distortion component level detecting means that is so referred to in the present invention. The function of the post peak elimination averager 14 and the function of the optimizing controller 15 constitute the vector adjustment controlling means that is so referred to in the present invention. The function of the peak value averager 16 and the function of the optimizing controller 17 constitute the pre-distortor control means that is so referred to in the present invention.

Incidentally, in the distortion-compensated amplifier device according to this embodiment, for example, in case the peak values of the distortion component levels that are detected by the level detector 12 have exceeded a prescribed threshold value, or in case, regarding this level, the average value of the peak values becoming equal to or greater than a prescribed value has exceeded a prescribed threshold value, it is also possible to make up a construction of controlling the pre-distortor 3 by the optimizing controller 17 accordingly. In such a construction, the control part has the function of determining whether the peak values of those levels have exceeded a prescribed threshold value and detecting this exceeding (the function corresponds to the peak detecting means that is so referred to in the present invention). Or the control part has the function of determining whether the average value of the peak values of those levels has exceeded a prescribed threshold value and detecting this exceeding (the function corresponds to the average peak detecting means that is so referred to in the present invention).

Figure 7:
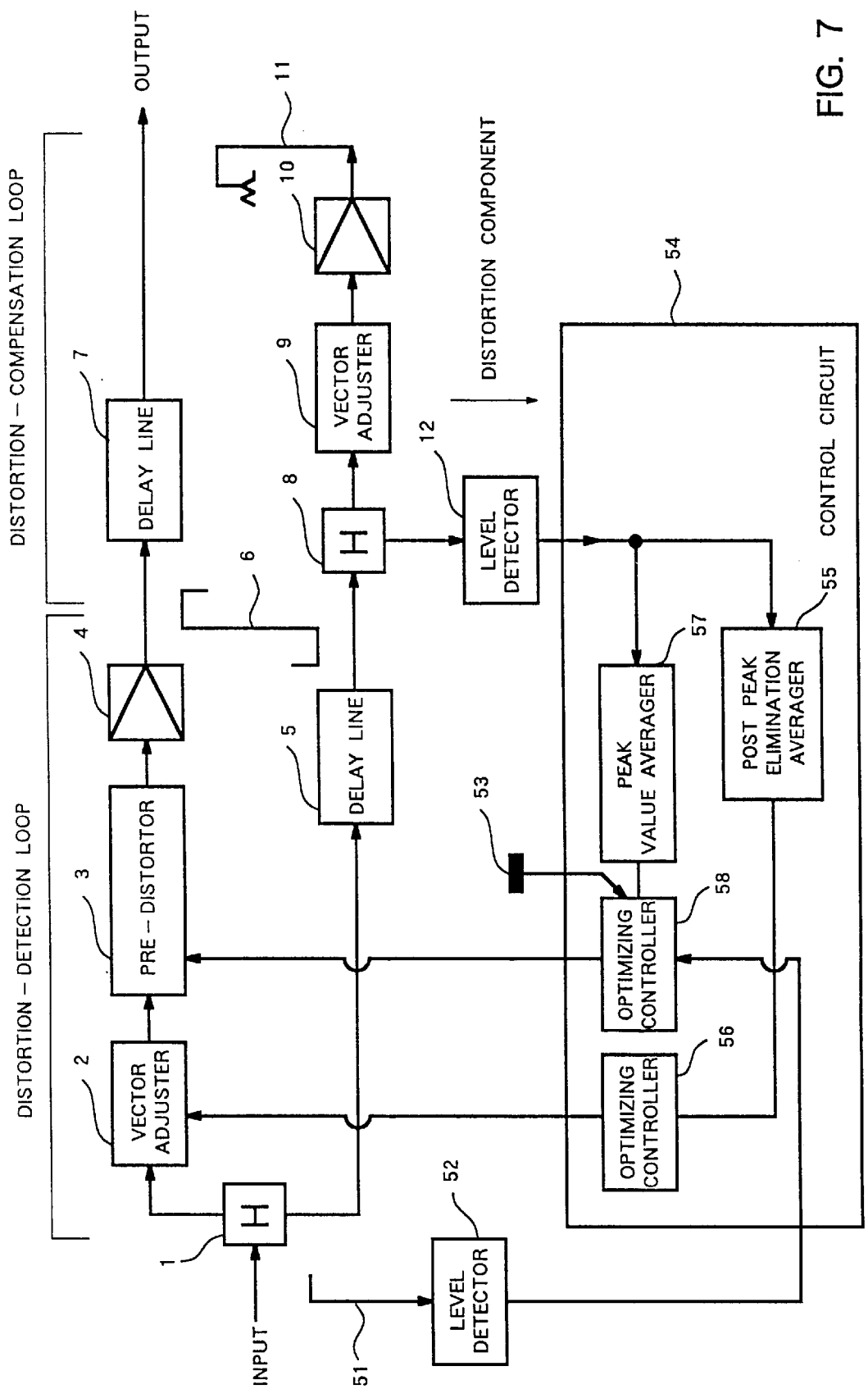
FIG. 7 is a view illustrating another example of the circuit construction of the distortion compensating amplifier device according to the present invention.
Figure 8:
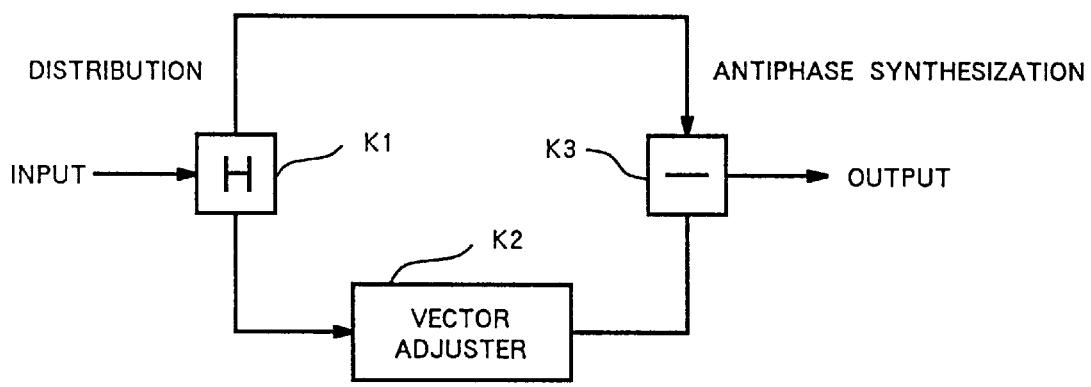
FIG. 8 is a view illustrating an example of the model wherein the distortion-detecting loop has been simplified.
Figure 9:
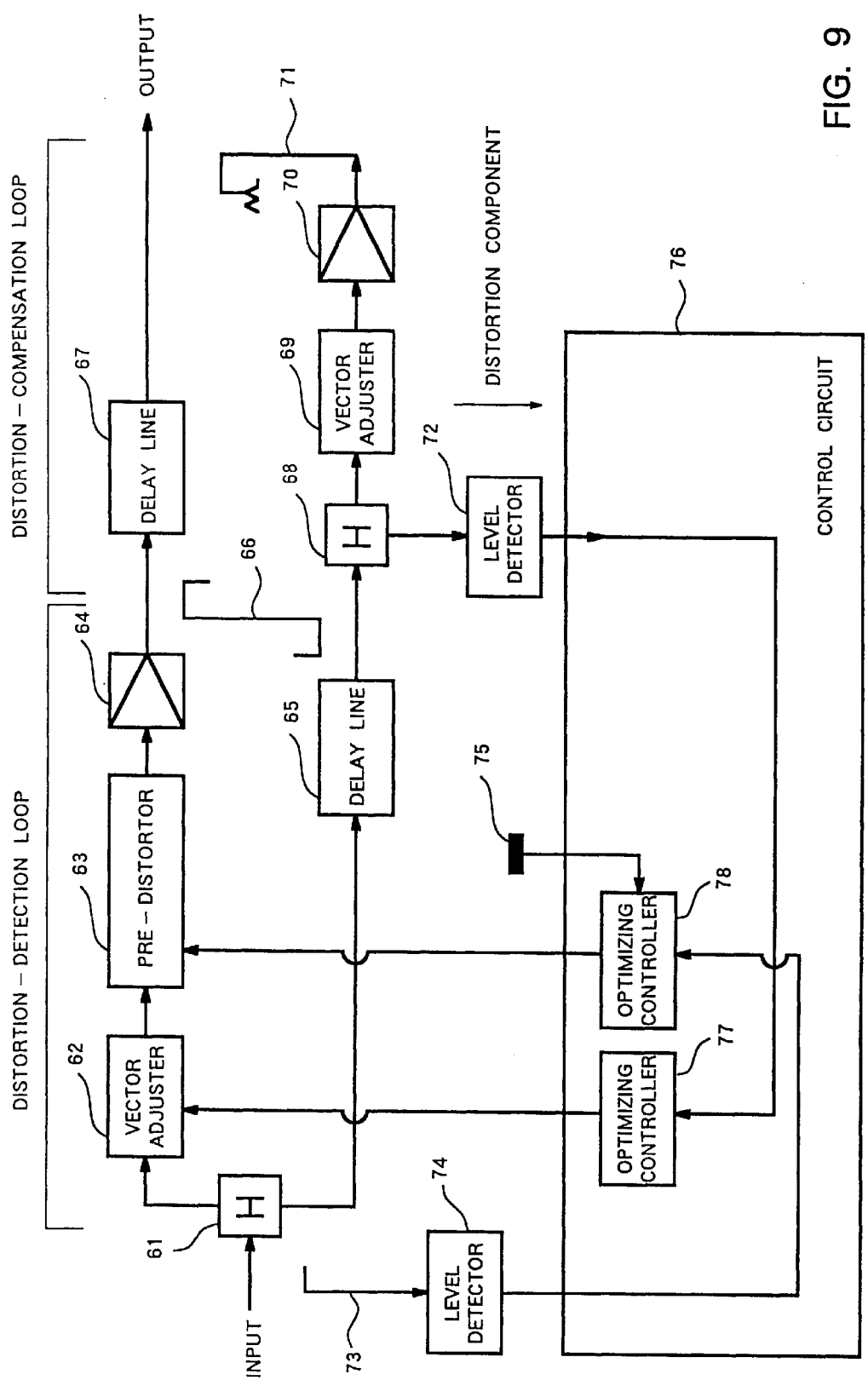
FIG. 9 a view illustrating an example of the circuit construction of a conventional distortion-compensated amplifier device.
Figure 10:
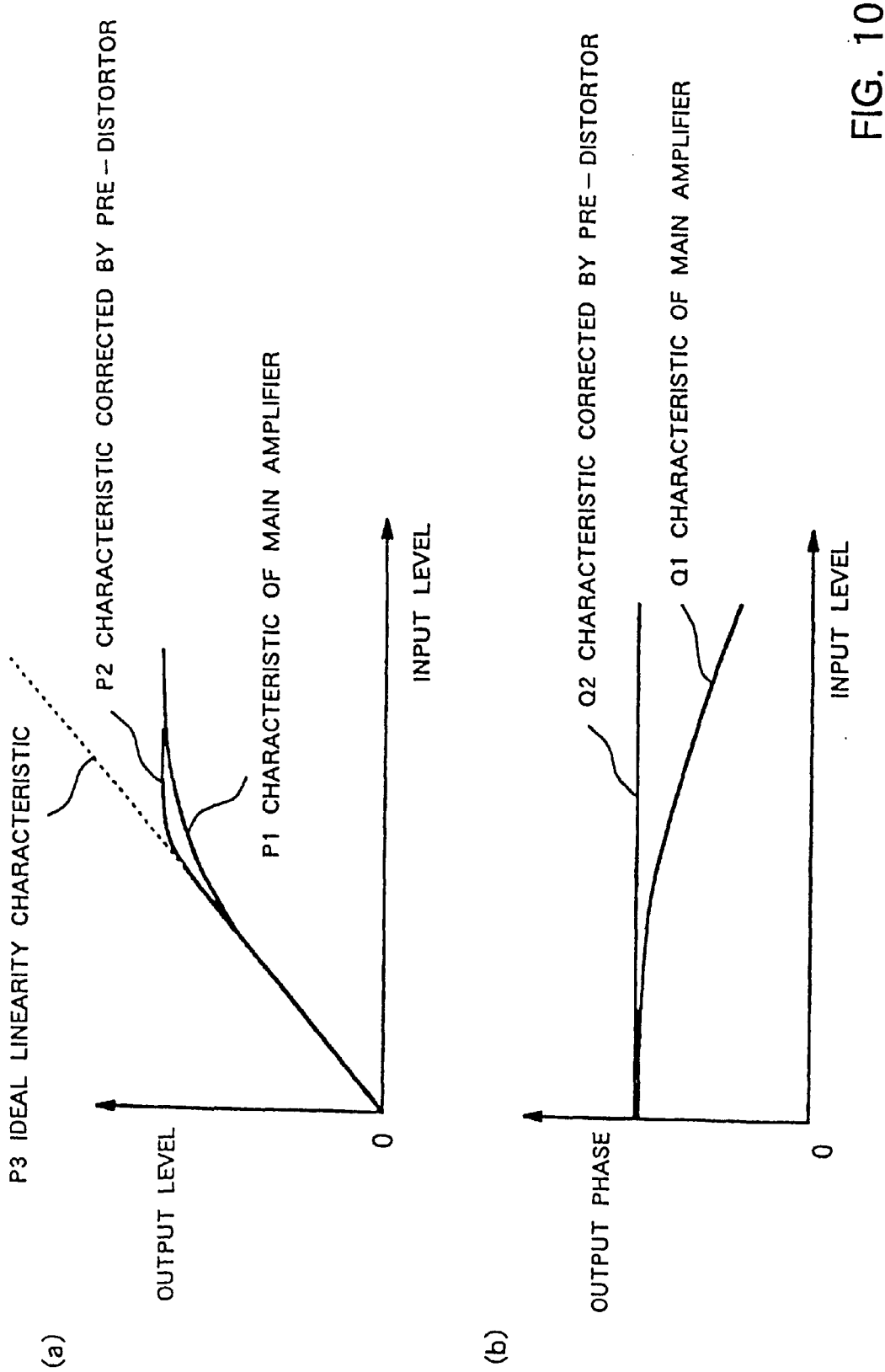
FIGS. 10(a) and 10(b) each are a view illustrating an example of the distortion compensation that is performed using the pre-distortor.
Figure 11:
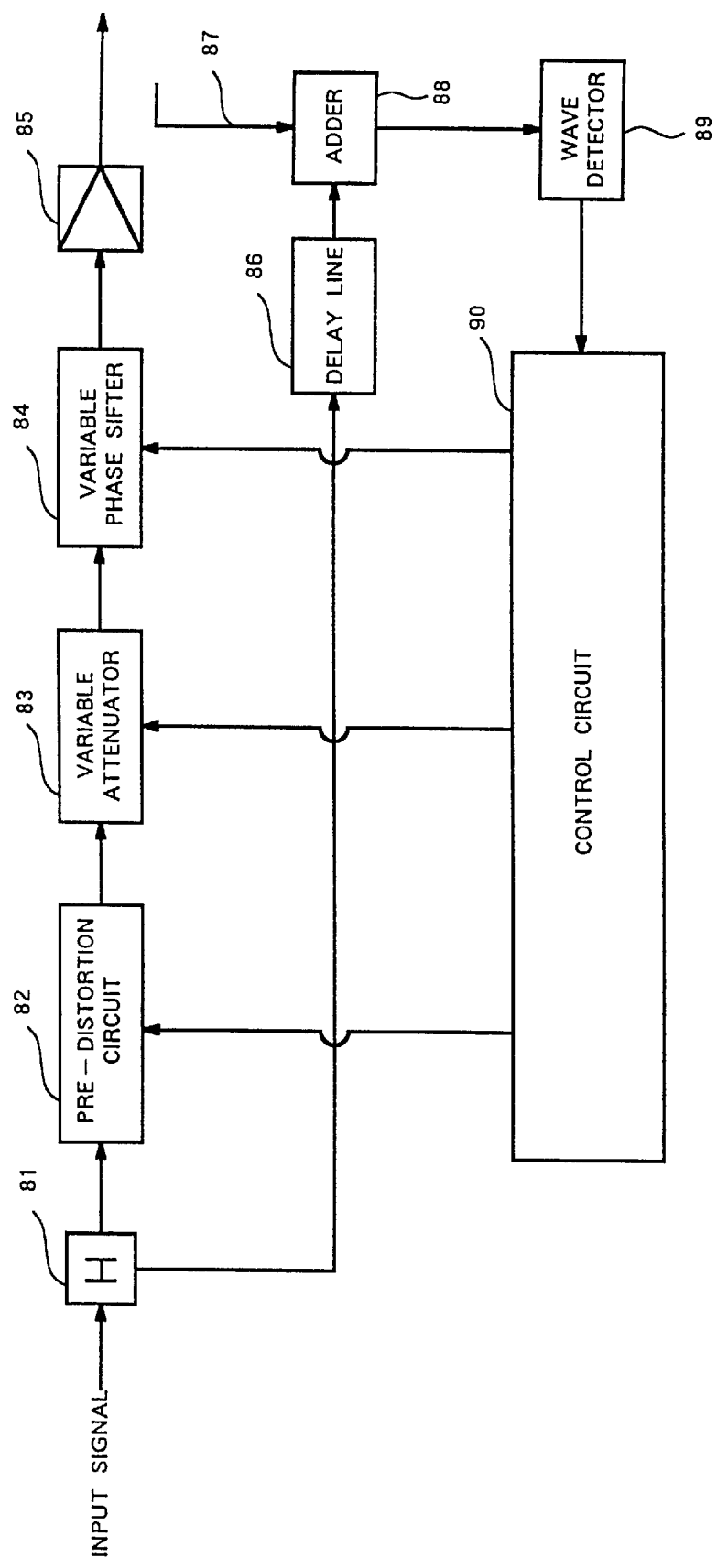
FIG. 11 is a view illustrating an example of a conventional pre-distortion automatically adjusting circuit.

Next, in FIG. 7, there is illustrated another example of the circuit construction of the distortion compensating amplifier device according to the present invention. It is to be noted that the construction of the distortion-compensated amplifier device illustrated in FIG. 7, except for the respect of, for example, being different from the construction of the control part, is the same as the construction of the distortion-compensated amplifier device illustrated in the above-described FIG. 1. For this reason, in the distortion-compensated amplifier device illustrated in FIG. 7, for brevity of explanation, the processing parts 1 to 11, constituting the distortion-detecting loop and the distortion-compensating loop, that are the same as the distortion-compensated amplifier device illustrated in FIG. 1, are illustrated with the same reference numerals as in the case of FIG. 1. Also, similarly, regarding the level detector 12 of the control part, since its construction is the same as in the case of FIG. 1, it is illustrated with the same reference numerals as in FIG. 1.

The control part of the distortion-compensated amplifier device according to this another embodiment of the present invention is equipped with the above-described level detector 12. It is also equipped with the directional coupler 51, level detector 52, temperature sensor 53, and control circuit 54. Further, the control circuit 54 is equipped with the post peak elimination averager 55, the optimizing controller 56 for controlling the vector adjuster 2, the peak value averager 57, and the optimizing controller 58 for controlling the pre-distortor 3.

Here, the constructions and the operations of the post peak elimination averager 55 and the optimizing controller 56 are respectively the same as the respective those of the post peak elimination averager 14 and the optimizing controller 15, illustrated in FIG. 1 for example. Namely, the post peak elimination averager 55 and the optimizing controller 56 perform optimum control of the vector adjuster 2 according to the detected result that is input from the level detector 12.

The directional coupler 51 is equipped to the input end of the distributor 1 of the distortion-detecting loop. It gets part of the signal that is input (to the distortion-compensated amplifier device of this embodiment), and outputs this partial input signal to the level detector 52. It is to be noted that the remaining portion of the input signal (that has been input to the distortion-compensated amplifier device of this embodiment) is output to the distributor 1.

The level detector 52 detects the level of the signal input from the directional coupler 51, and outputs this detected result to the optimizing controller 58. It is to be noted that, in this embodiment, the levels that are detected by the level detector 52 become ones that reflect (e.g. are proportionate to) the levels of the signal that is input to the main amplifier 4.

The temperature sensor 53 detects, for example, the temperature of the main amplifier 4, or the temperature of the places where that temperature can be estimated, and outputs this detected result to the optimizing controller 58.

The construction and the operation of the peak value averager 57 are the same as those of the peak value averager 16 illustrated in FIG. 1, for example. Namely, the peak value averager 57 averages the peak values of the levels of the distorted component that is detected by the level detector 12, and outputs this averaged value to the optimizing controller 58.

The optimizing controller 58 operates according to the detected result of the level of the input signal input from the level detector 52 and the detected result of the temperature input from the temperature sensor 53. Further, it operates according to the average value of the peak values of the distortion component levels input from the peak value averager 57. Namely, according to those results and value, the controller 58 controls the pre-distortor 3 so that this average value may become small (preferably minimum).

Here, in the optimizing controller 58, as one example, it is possible, for example, to make the following two types of information correspond to each other beforehand and store the both information in a memory. One is control condition information that includes information that regards the detected result of the level detector 52, the detected result of the temperature sensor 53, and the average value of the peak value averager 57. The other is control values for controlling the pre-distortor 3. In this case, the optimizing controller 58 gets (particularizes) the control condition information that corresponds to the value that is notified from the level detector 52, temperature sensor 53, and peak value averager 57. It then reads out from the memory the control value that corresponds to the control condition information and thereby controls the pre-distortor 3 with use of that control value. It thereby can realize the control for example in a simple, quick way.

As described above, in the distortion-compensated amplifier device of this embodiment, it is possible to bring about the effect attainable with the distortion-compensated amplifier device illustrated in FIG. 1 for example. Further, by performing the control according to the level of the signal processed by the main amplifier 4 and the temperature of this amplifier 4, the device can realize the high precision compensation of distortion.

Here, in this embodiment, the function of the level detector 52 constitutes the main amplifier-level detecting means that is so referred to in the present invention. The function of the temperature sensor 53 constitutes the temperature detecting means that is so referred to in the present invention.

Incidentally, in this embodiment, a construction of controlling the pre-distortor 3 according to the level of the signal amplified by the main amplifier 4 and the temperature of this amplifier has been illustrated. However, the way of controlling, which is similar to that, can also be applied, for example, to the optimizing controller 56 for controlling the vector adjuster 2.

Here, the construction of the distortion-compensated amplifier device according to the present invention and the mode in which to perform the distortion-compensated amplification method are not always limited to the ones that have been described above. Various constructions and modes may be adopted.

Also, the present invention is suitably applied to a device for amplifying a signal containing instantaneous peak powers such as, for example, a CDMA signal. The invention is not always limited thereto but can be applied to various fields of devices.

Also, as means for executing various pieces of processing that include, for example, the distortion compensation processing that is executed with the distortion-compensated amplifier device or distortion-compensated amplification method according to the present invention, the following construction may be used. It is that, for example, in hardware resources equipped with a processor, a memory, etc., control operations are performed by execution, by the processor, of a control program stored in a ROM. In addition, respective functional means for, for example, executing such various pieces of processing may be constructed, respectively, as independent hardware circuits.

Further, the present invention can also be understood as a computer-readable recording medium such as a floppy disk, or a CD-ROM, having stored therein the above-described control program. By inputting the control program from the recording medium to a computer and causing the processor to execute the program, it is possible to execute the processes according to the present invention.

As has been described above, according to the distortion-compensated amplifier device and the distortion-compensated amplification method of the present invention, the signal is distributed in the distortion-detecting loop. With respect to one distribution signal, vector adjustment is performed and a distortion is generated in the pre-distortor. Then, this one distribution signal is amplified by the main amplifier. Then, this amplification signal and the other distribution signal are composed, thereby detecting a distorted component contained in that amplification signal. On the other hand, in the distortion-compensating loop, the amplification signal from the main amplifier and the distortion component detected by the distortion-detecting loop are composed, thereby eliminating the distortion component from that amplification signal. At this time, there are detected the levels of the distortion component that is detected by the distortion-detecting loop. And, vector adjustment is controlled so that the average value of those levels may become small, and generation of the distortion by the pre-distortor is controlled so that the peak values of those levels may become small. For this reason, as a whole, it is possible to realize excellent compensation of the distortion.

What is claimed is:

1. A distortion-compensated amplifier device comprising a distortion-detecting loop wherein an input signal to the distortion-compensated amplifier device is distributed; with respect to one distribution signal vector adjustment is performed by vector adjustment means and a distortion is generated by a pre-distortor; the one distribution signal is amplified by a main amplifier; and the amplification signal and the other distribution signal are composed to thereby detect a distortion component contained in the amplification signal, a distortion-compensating loop wherein the amplification signal from the main amplifier and the distortion component detected by the distortion-detecting loop are composed to thereby eliminate the distortion-component from the amplification signal, and a control part that according to the distortion component detected by the distortion-detecting loop controls the vector adjustment of the vector adjustment means and the generation of the distortion of the pre-distortor, wherein the control part comprises distortion component level detecting means that detects the level of the distortion component detected by the distortion-detecting loop;

vector adjustment controlling means that controls the vector adjustment of the vector adjustment means so that an average value of the levels detected by the distortion component level detecting means may become small; and pre-distortor controlling means that controls the generation of the distortion of the pre-distortor so that peak values of the levels detected by the distortion component level detecting means may become small.

2. A distortion-compensated amplifier device according to claim 1, wherein the vector adjustment controlling means controls the vector adjustment of the vector adjustment means so that, regarding the levels detected by the distortion component level detecting means, an average value of the levels thereof the values of that are smaller than a prescribed value may become small.

3. A distortion-compensated amplifier device according to claim 1, wherein the pre-distortor controlling means controls the generation of the distortion of the pre-distortor so that, regarding the levels detected by the distortion component level detecting means, an average value of the peak values thereof that are equal to greater than a prescribed value may become small.

4. A distortion-compensated amplifier device according to claim 2, wherein the pre-distortor controlling means controls the generation of the distortion of the pre-distortor so that, regarding the levels detected by the distortion component level detecting means, an average value of the peak values thereof that are equal to greater than a prescribed value may become small.

5. A distortion-compensated amplifier device according to claim 1, wherein the control part include speak detecting means that detects that the peak values of the levels detected by the distortion component level detecting means have exceeded a prescribed threshold value; and the pre-distortor controlling means controls the generation of the distortion of the pre-distortor correspondingly to the fact that detection has occurred in the peak detecting means.

6. A distortion-compensated amplifier device according to claim 2, wherein the control part includes peak detecting means that detects that the peak values of the levels detected by the distortion component level detecting means have exceeded a prescribed threshold value; and the pre-distortor controlling means controls the generation of the distortion of the pre-distortor correspondingly to the fact that detection has occurred in the peak detecting means.

7. A distortion-compensated amplifier device according to claim 3, wherein the control part includes peak detecting means that detects that the peak values of the levels detected by the distortion component level detecting means have exceeded a prescribed threshold value; and the pre-distortor controlling means controls the generation of the distortion of the pre-distortor correspondingly to the fact that detection has occurred in the peak detecting means.

8. A distortion-compensated amplifier device according to claim 4, wherein the control part includes peak detectin means that detects that the peak values of the levels detected by the distortion component level detecting means have exceeded a prescribed threshold value; and the pre-distortor controlling means controls the generation of the distortion of the pre-distortor correspondingly to the fact that detection has occurred in the peak detecting means.

9. A distortion-compensated amplifier device according to claim 3, wherein the control part includes average peak detecting means that detects that, regarding the levels detected by the distortion component level detecting means, an average value of the peak values thereof that are equal to greater than a prescribed value has exceeded a prescribed threshold value; and the pre-distortor controlling means controls the generation of the distortion of the pre-distortor correspondingly to the fact that detection has occurred in the average peak detecting means.

10. A distortion-compensated amplifier device according to claim 4, wherein the control part includes average peak detecting means that detects that, regarding the levels detected by the distortion component level detecting means, an average value of the peak values thereof that are equal to greater than a prescribed value has exceeded a prescribed threshold value; and the pre-distortor controlling means controls the generation of the distortion of the pre-distortor correspondingly to the fact that detection has occurred in the average peak detecting means.

11. A distortion-compensated amplifier device according to claim 1, wherein at least either one of the pre-distortor controlling means and the vector adjustment controlling means has main amplifier level detecting means for detecting the level of the signal amplified by the main amplifier and temperature detecting means for detecting the temperature, and has a memory in that there is stored control condition information includes information that regards the values based on the levels detected by the distortion component level detecting means, the levels detected by the main amplifier level detecting means, and the temperature detected by the temperature detecting means in a state of its being in correspondence with control values for performing the control, whereby the control values corresponding to the control condition information that is gotten are readout from the memory, and, by the use of those control values, the control is performed.

12. A distortion-compensated amplifier device according to claim 2, wherein at least either one of the pre-distortor controlling means and the vector adjustment controlling means has main amplifier level detecting means for detecting the level of the signal amplified by the main amplifier and temperature detecting means for detecting the temperature, and has a memory in that there is stored control condition information includes information that regards the values based on the levels detected by the distortion component level detecting means, the levels detected by the main amplifier level detecting means, and the temperature detected by the temperature detecting means in a state of its being in correspondence with control values for performing the control, whereby the control values corresponding to the control condition information that is gotten are read out from the memory, and, by the use of those control values, the control is performed.

13. A distortion-compensated amplifier device according to claim 3, wherein at least either one of the pre-distortor controlling means and the vector adjustment controlling means has main amplifier level detecting means for detecting the level of the signal amplified by the main amplifier and temperature detecting means for detecting the temperature, and has a memory in that there is stored control condition information includes information that regards the values based on the levels detected by the distortion component level detecting means, the levels detected by the main amplifier level detecting means, and the temperature detected by the temperature detecting means in a state of its being in correspondence with control values for performing the control, whereby the control values corresponding to the control condition information that is gotten are readout from the memory, and, by the use of those control values, the control is performed.

14. A distortion-compensated amplifier device according to claim 4, wherein at least either one of the pre-distortor controlling means and the vector adjustment controlling means has main amplifier level detecting means for detecting the level of the signal amplified by the main amplifier and temperature detecting means for detecting the temperature, and has a memory in that there is stored control condition information includes information that regards the values based on the levels detected by the distortion component level detecting means, the levels detected by the main amplifier level detecting means, and the temperature detected by the temperature detecting means in a state of its being in correspondence with control values for performing the control, whereby the control values corresponding to the control condition information that is gotten are read out from the memory, and, by the use of those control values, the control is performed.

15. A distortion-compensated amplification method wherein a signal is distributed; with respect to one distribution signal, vector adjustment is performed and a distortion is generated; this one distribution signal is amplified by a main amplifier; this amplification signal and the other distribution signal are composed, thereby detecting a distortion component contained in the amplification signal; and when composing the amplification signal from the main amplifier and the distortion component detected, thereby eliminating the distortion component from the amplification signal, the vector adjustment and the generation of the distortion are controlled, vector adjustment is controlled so that the average value of the levels of the distortion component detected may become small, and the generation of the distortion is controlled so that the peak values of those levels may become small.

16. A communication apparatus for use in a mobile wireless communication system, the communication apparatus comprising a distortion-compensated amplifier device that includes a distortion-detecting loop, a distortion-compensating loop, and a control part, wherein in the distortion-compensated amplifier device, the distortion-detecting loop includes a first distributor that distributes a signal; a first vector adjuster that performs vector adjustment with respect to one distribution signal; a pre-distortor that generates a distortion with respect to the one distribution signal; a main amplifier that amplifies the one distribution signal with respect to that vector adjustment has been performed and the distortion has been generated; a first delay line that delays the other distribution signal; and a first directional coupler that composes an amplification signal from the main amplifier and the delayed other distribution signal to thereby detect a distortion component contained in the amplification signal, the distortion-compensating loop includes a second delay line that delays the amplification signal from the main amplifier; a second distributor that distributes the distortion component detected by the first directional coupler; a second vector adjuster that performs vector adjustment with respect to the one distribution distortion component signal, an error amplifier that amplifies the one distribution distortion component signal with respect to that vector adjustment has been performed; and a second directional coupler that composes a delayed amplification signal from the main amplifier and the amplified one distribution distortion component signal to thereby eliminate a distortion component from the amplification signal, and the control part includes a first level detector that detects the level of the other distribution distortion component signal from the second distributor; a post peak elimination averager that detects, regarding the level detected by the first level detector, an average value of the remaining level portion that has been prepared by eliminating a peak portion thereof from that level; a first optimizing controller that controls the vector adjustment of the first vector adjuster so that said average value may become small; a peak value averager that detects, regarding the level detected by the first level detector, an average value of peak values thereof; and a second optimizing controller that controls the generation of the distortion of the pre-distortor so that said average value may become small.

17. A communication apparatus for use in a mobile wireless communication system, according to claim 16, wherein in the distortion-compensated amplifier device, the control part includes a third directional coupler that gets part of the signal input to the first distributor; a second level detector that detects the level of the signal gotten by the third directional coupler; and a temperature detector that detects a temperature, and the second optimizing controller controls the generation of the distortion of the pre-distortor according to the detected result of the second level detector and the detected result of the temperature detector.

* * * * *